(12) United States Patent
Kanayama et al.

(10) Patent No.: US 11,515,088 B2
(45) Date of Patent: Nov. 29, 2022

(54) ONBOARD POWER SOURCE DEVICE

(71) Applicant: Panasonic Intellectual Property Management Co., Ltd., Osaka (JP)

(72) Inventors: Masashi Kanayama, Osaka (JP); Hiroshi Akamatsu, Osaka (JP); Yuji Doi, Osaka (JP); Katsunori Atago, Fukushima (JP); Hiroki Nishinaka, Osaka (JP); Youichi Kageyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 95 days.

(21) Appl. No.: 17/271,298

(22) PCT Filed: Nov. 18, 2019

(86) PCT No.: PCT/JP2019/045032
§ 371 (c)(1),
(2) Date: Feb. 25, 2021

(87) PCT Pub. No.: WO2020/116138
PCT Pub. Date: Jun. 11, 2020

(65) Prior Publication Data
US 2021/0183568 A1 Jun. 17, 2021

(30) Foreign Application Priority Data
Dec. 5, 2018 (JP) .............................. JP2018-227859

(51) Int. Cl.
*H01G 2/06* (2006.01)
*H05K 1/11* (2006.01)
*H05K 1/18* (2006.01)

(52) U.S. Cl.
CPC ............... *H01G 2/06* (2013.01); *H05K 1/115* (2013.01); *H05K 1/184* (2013.01); *H05K 2201/10015* (2013.01); *H05K 2201/10522* (2013.01)

(58) Field of Classification Search
CPC ....................................................... H01G 2/06
(Continued)

(56) References Cited

U.S. PATENT DOCUMENTS

| 2014/0321090 A1* | 10/2014 | Guerin | H01G 9/26 29/854 |
| 2016/0150662 A1* | 5/2016 | Maier | H05K 3/303 361/767 |
| 2020/0068738 A1* | 2/2020 | Wells | H05K 7/14 |

FOREIGN PATENT DOCUMENTS

JP  2000-243656  9/2000

OTHER PUBLICATIONS

International Search Report of PCT application No. PCT/JP2019/045032 dated Feb. 4, 2020.

* cited by examiner

*Primary Examiner* — Stanley Tso
(74) *Attorney, Agent, or Firm* — WHDA, LLP (57) ABSTRACT

An onboard power supply device includes capacitors, a holder holding the capacitors, a mounting board having the capacitors mounted thereon and having the holder fixed thereto, and a heat-generating component mounted on the mounting board. Each of the capacitors includes a capacitor body and a lead terminal extending from the capacitor body. The holder includes a base part, first holding parts bundled by the base part and holding the capacitors, second holding parts each connected to a corresponding one of the first holding parts, and a fixing part extending from an outer edge of the base part toward the mounting board and fixed to the (Continued)

mounting board. The capacitor body of each of the capacitors is held by a corresponding one of the first holding parts. The lead terminal of each of the capacitors is held by a corresponding one of the second holding parts. The mounting board has a through-hole therein through which the lead terminal passes. The through-hole is connected to the lead terminal. The corresponding one of the second holding parts has a holding through-hole therein extending along a through-axis coinciding with the through-hole. An inner wall of the holding through-hole contacts the lead terminal. This onboard power supply device has a small size.

7 Claims, 5 Drawing Sheets

(58) Field of Classification Search
USPC .......................................................... 361/782
See application file for complete search history.

ONBOARD POWER SOURCE DEVICE

CROSS-REFERENCE TO RELATED APPLICATIONS

This application is a U.S. national stage application of the PCT international application No. PCT/JP2019/045032 filed on Nov. 18, 2019, which claims the benefit of foreign priority of Japanese patent application No. 2018-227859 filed on Dec. 5, 2018, the contents all of which are incorporated herein by reference

TECHNICAL FIELD

The present invention relates to an onboard power supply device used for various vehicles.

BACKGROUND ART

Figure 5:
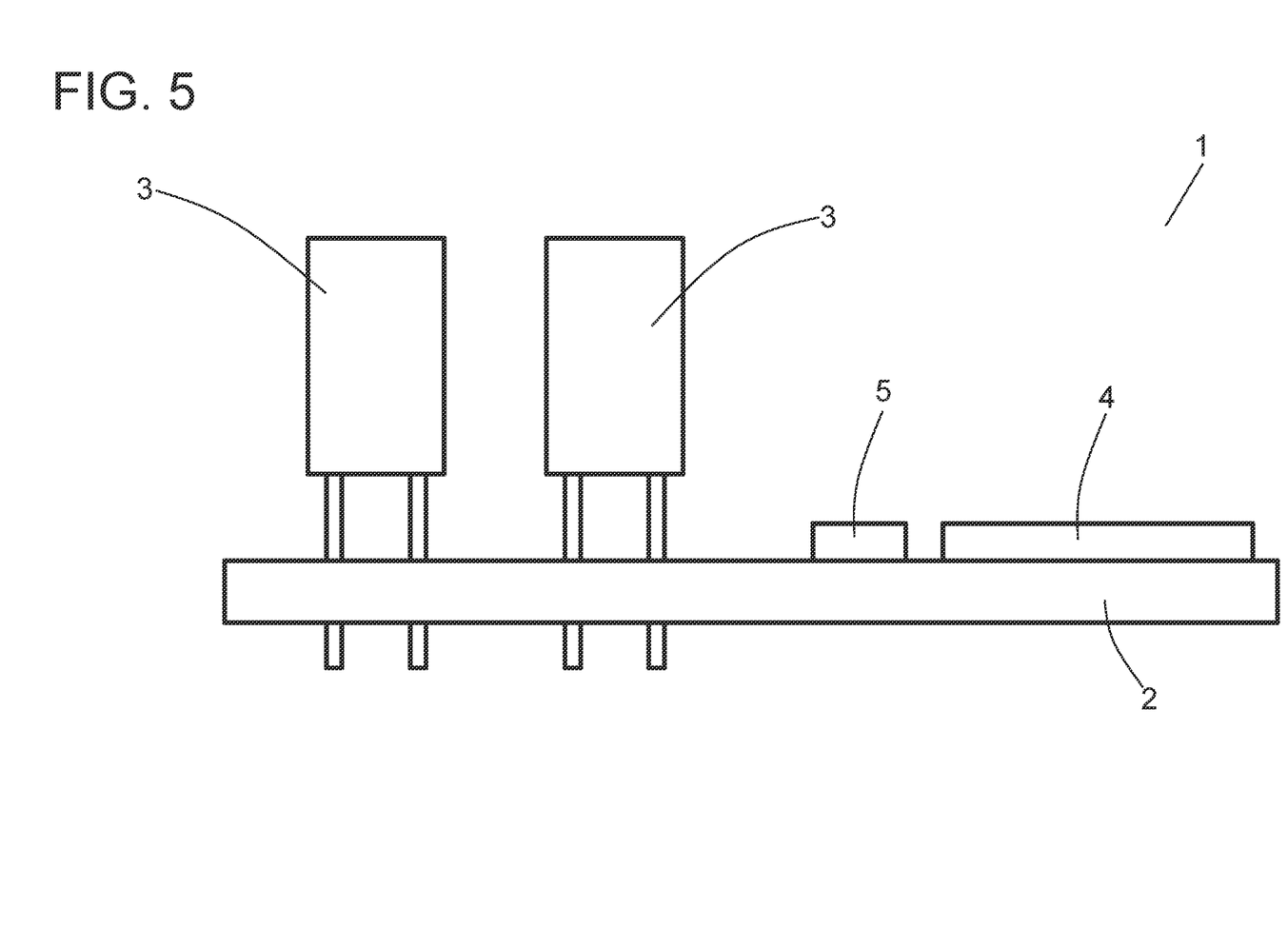
FIG. 5 is a side view of a conventional onboard power supply device.

FIG. 5 is a side view of the conventional onboard power supply device. The onboard power supply device 1 includes electricity storage part 3, power converter 4 and controller 5 which are mounted on mounting board 2. Power converter 4 perform operations: a charging operation in which electric power supplied from the outside of onboard power supply device 1 is charged in electricity storage part 3; and a discharging operation in which the electric power is outputted to the outside of onboard power supply device 1. A converter function performing switching operation of power converter 4 performs the charging operation and the discharging operation. Controller 5 controls an operation of power converter 4 depending on its state.

Power converter 4 generates a lot of heat due to the switching operation of the converter function. In order to suppress a thermal influence on electricity storage part 3 from power converter 4 or a noise influence on controller 5, power converter 4 is disposed on mounting board 2 not close to electricity storage part 3 and controller 5.

A conventional onboard power supply device is similar to onboard power supply device 1 is disclosed in, e.g. PTL 1.

CITATION LIST

Patent Literature

PTL 1: Japanese Patent Laid-Open Publication No. 2000-243656

SUMMARY

An onboard power supply device includes capacitors, a holder holding the capacitors, a mounting board having the capacitors mounted thereon and having the holder fixed thereto, and a heat-generating component mounted on the mounting board. Each of the capacitors includes a capacitor body and a lead terminal extending from the capacitor body. The holder includes a base part, first holding parts bundled by the base part and holding the capacitors, second holding parts each connected to a corresponding one of the first holding parts, and a fixing part extending from an outer edge of the base part toward the mounting board and fixed to the mounting board. The capacitor body of each of the capacitors is held by a corresponding one of the first holding parts. The lead terminal of each of the capacitors is held by a corresponding one of the second holding parts. The mounting board has a through-hole therein through which the lead terminal passes. The through-hole is connected to the lead terminal. The corresponding one of the second holding parts has a holding through-hole therein extending along a through-axis coinciding with the through-hole. An inner wall of the holding through-hole contacts the lead terminal.

This onboard power supply device has a small size.

DETAIL DESCRIPTION OF PREFERRED EMBODIMENT

Figure 1:
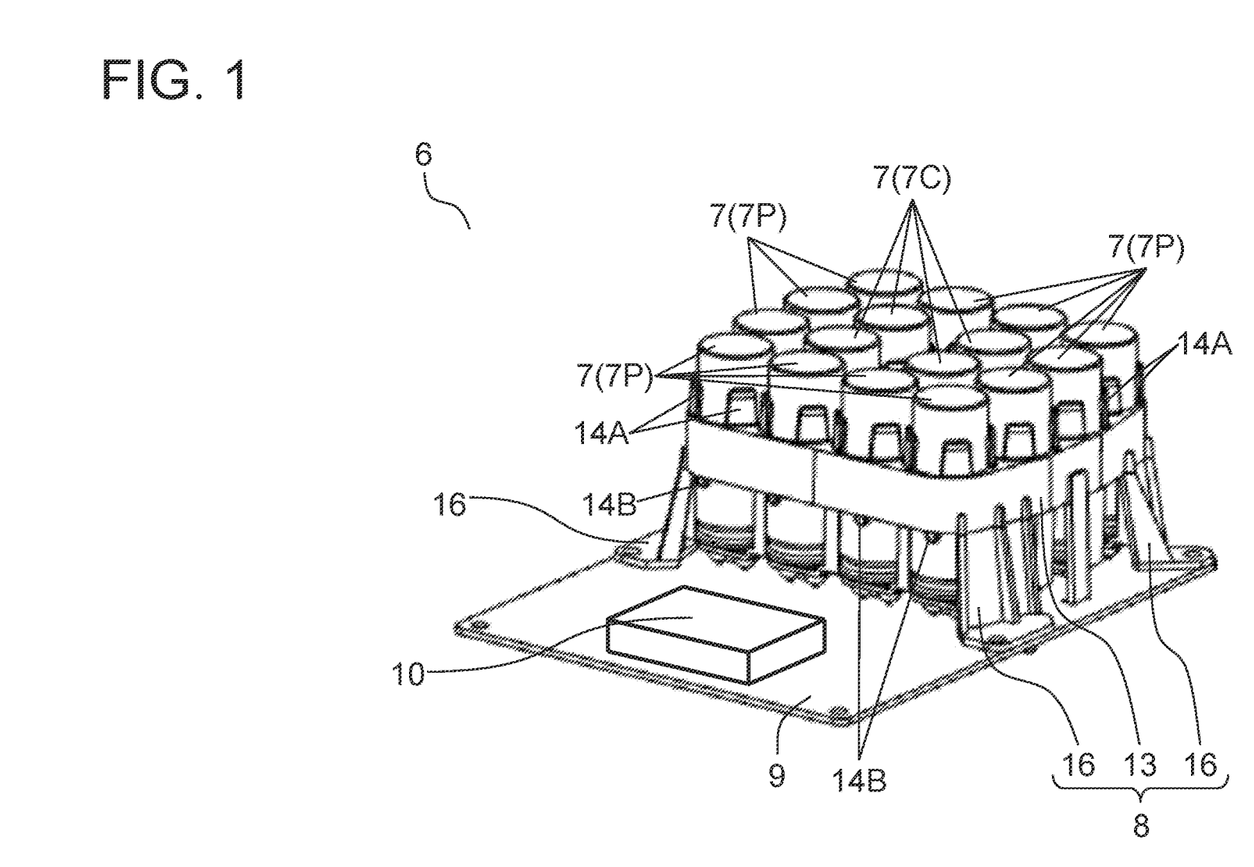
FIG. 1 is a perspective view of an onboard power supply device in accordance with an exemplary embodiment.
Figure 2:
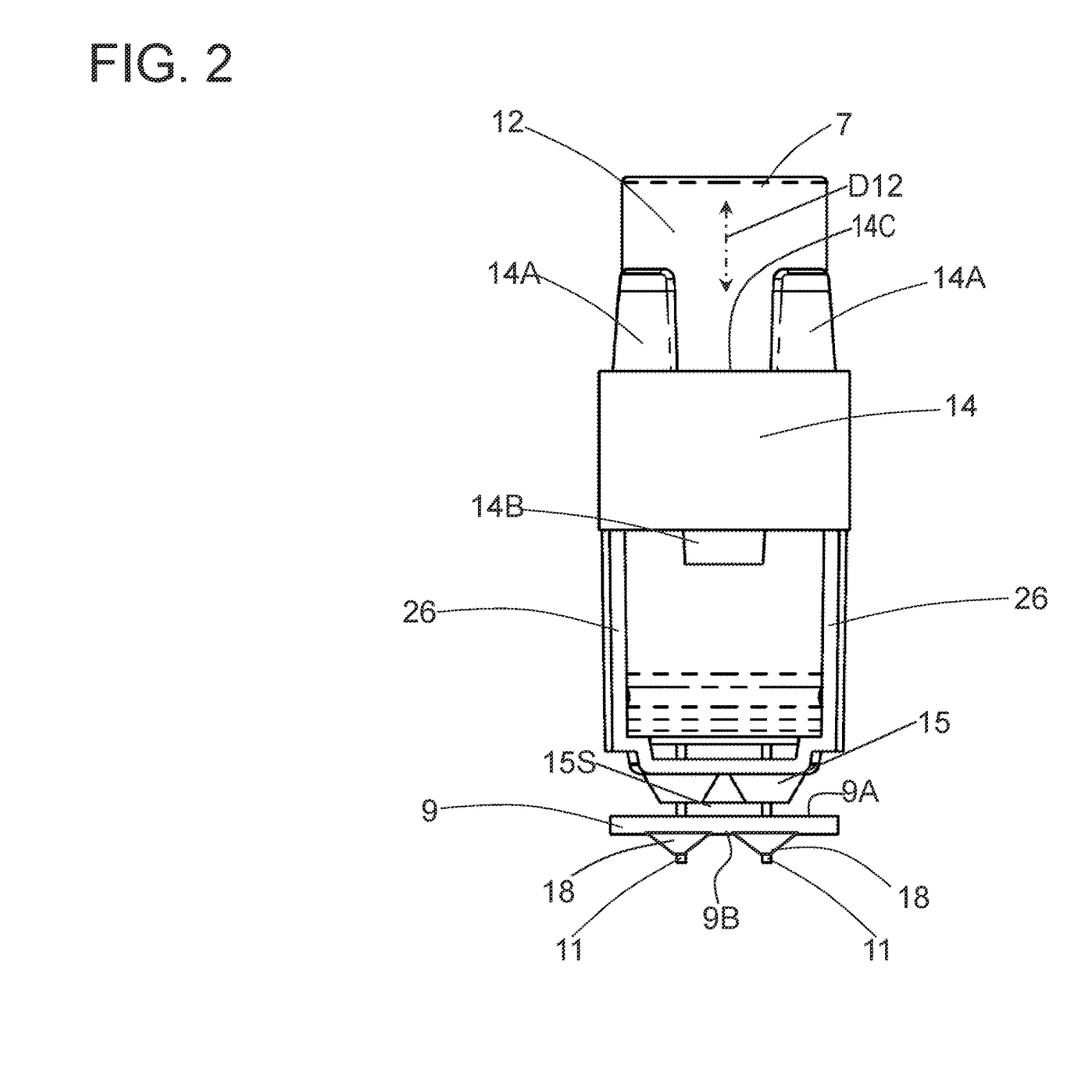
FIG. 2 is a partial side view of the onboard power supply device in accordance with the embodiment.
Figure 3:
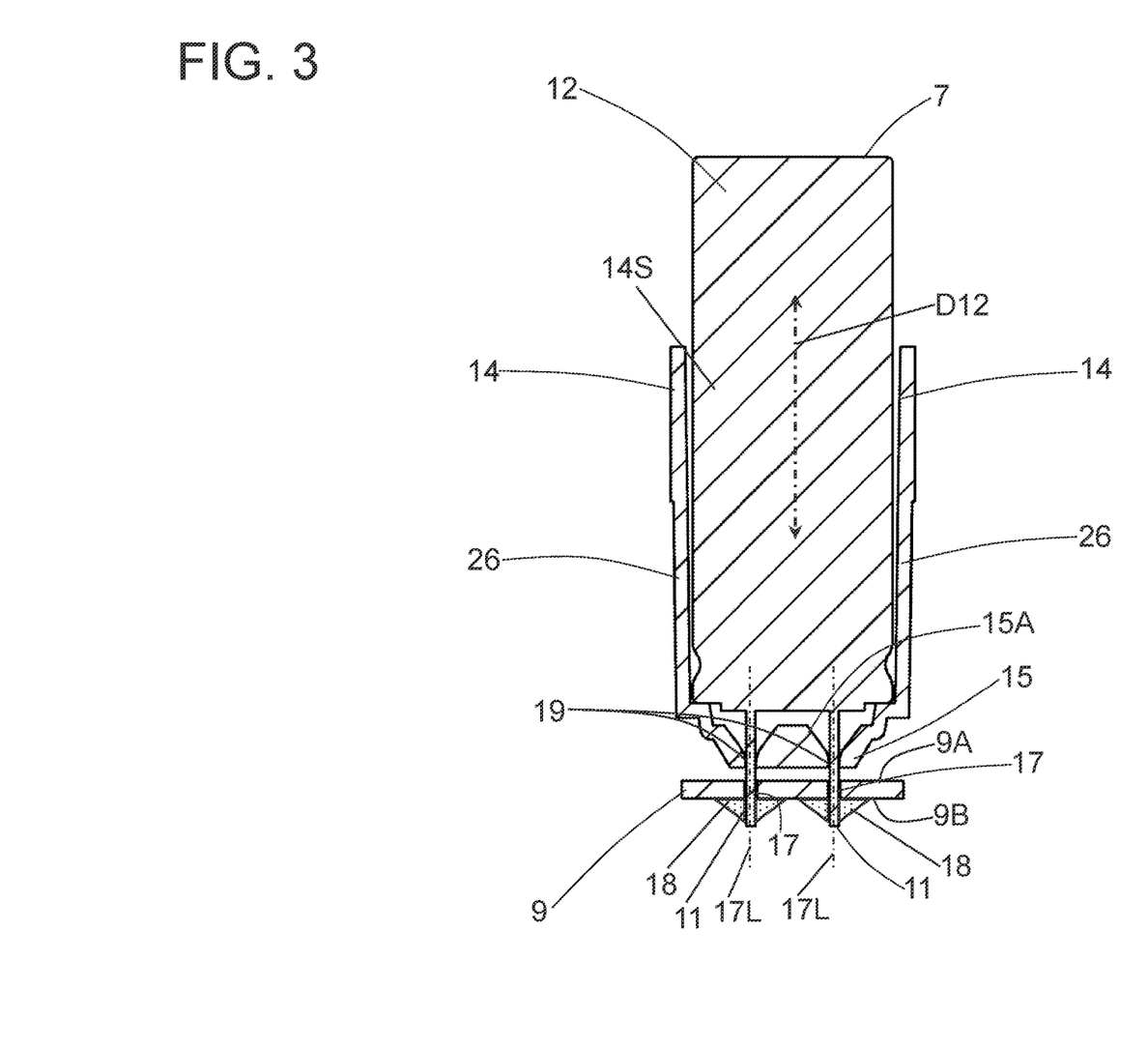
FIG. 3 is a partial cross-sectional view of the onboard power supply device in accordance with the embodiment.

FIG. 1 is a perspective view of an onboard power supply device 6 in accordance with an exemplary embodiment. FIG. 2 is a partial side view of the onboard power supply device 6. FIG. 3 is a partial cross-sectional view of the onboard power supply device 6.

Onboard power supply device 6 includes capacitors 7, holder 8, mounting board 9, and heat-generating component 10. The capacitors 7 are held by holder 8, and mounted on mounting surface 9A of mounting board 9. Holder 8 is fixed to mounting board 9. Heat-generating component 10 is fixed to mounting board 9.

Each capacitor 7 includes capacitor body 12 and lead terminal 11 extending from capacitor body 12. Capacitor body 12 functions as a capacitor constituting a capacitance of capacitor 7. Capacitor body 12 extends in axis direction D12. Holder 8 includes base part 13, holding parts 14, holding parts 15, and fixing part 16. Each of the holding parts 14 corresponds to a corresponding one of the capacitors 7. Each of the holding parts 15 corresponds to a corresponding one of the capacitors 7. Fixing part 16 extends from an outer edge of base part 13 toward mounting board 9, and is fixed to mounting board 9.

The holding parts 14 are bundled by base part 13. Each holding part 14 holds capacitor body 12 of each capacitor 7. Each holding part 15 is connected to a corresponding holding part 14. Lead terminal 11 of each capacitor 7 is held by a corresponding holding part 15.

Through-holes 17 are provided in mounting board 9. Lead terminal 11 of each capacitor 7 passes through a corresponding through-hole 17, and lead terminal 11 is joined to the corresponding through-hole 17 with joint part 18. A conductive wiring pattern is provided on surface 9B of mounting board 9 opposite to a mounting surface 9A. Lead terminal 11 is joined also to the conductive wiring pattern with joint part 18. Holding part 15 has holding through-hole 19 therein extending along through-axis 17L coinciding with through-hole 17. Lead terminal 11 of each capacitor 7 contacts an inner wall of holding through-hole 19.

While onboard power supply device 6 is in operation, heat is emitted from heat-generating component 10 and propagated to capacitor body 12 of each capacitor 7 via joint part 18 and lead terminal 11. Holding part 15 serves as a heat propagation path is disposed between joint part 18 and capacitor body 12, and contacts lead terminal 11. Accordingly, the heat propagated to lead terminal 11 is partially propagated to each holding part 15. Holding part 15 functions as a heat spreader for lead terminal 11. The heat propagated to holding part 15 is diffused into holder 8. This configuration suppresses heat propagation to capacitor body 12 of each capacitor 7 which may degrade due to heat. Consequently, heat-generating component 10 can be disposed close to the capacitors 7. This configuration reduces the size of the onboard power supply device 6.

In onboard power supply device 1 shown in FIG. 5, power converter 4 is disposed on mounting board 2 not close to electricity storage part 3 or controller 5. This configuration increases a floor area or a volume of onboard power supply device 1. Especially, electricity storage part 3 with a large capacitance increases an amount of heat generated by power converter 4, and accordingly, increases a floor area or a volume of onboard power supply device 1 since power converter 4 is necessarily disposed away from other components.

As mentioned above, onboard power supply device 6 in accordance with the embodiment is provided with a small size.

Figure 4:
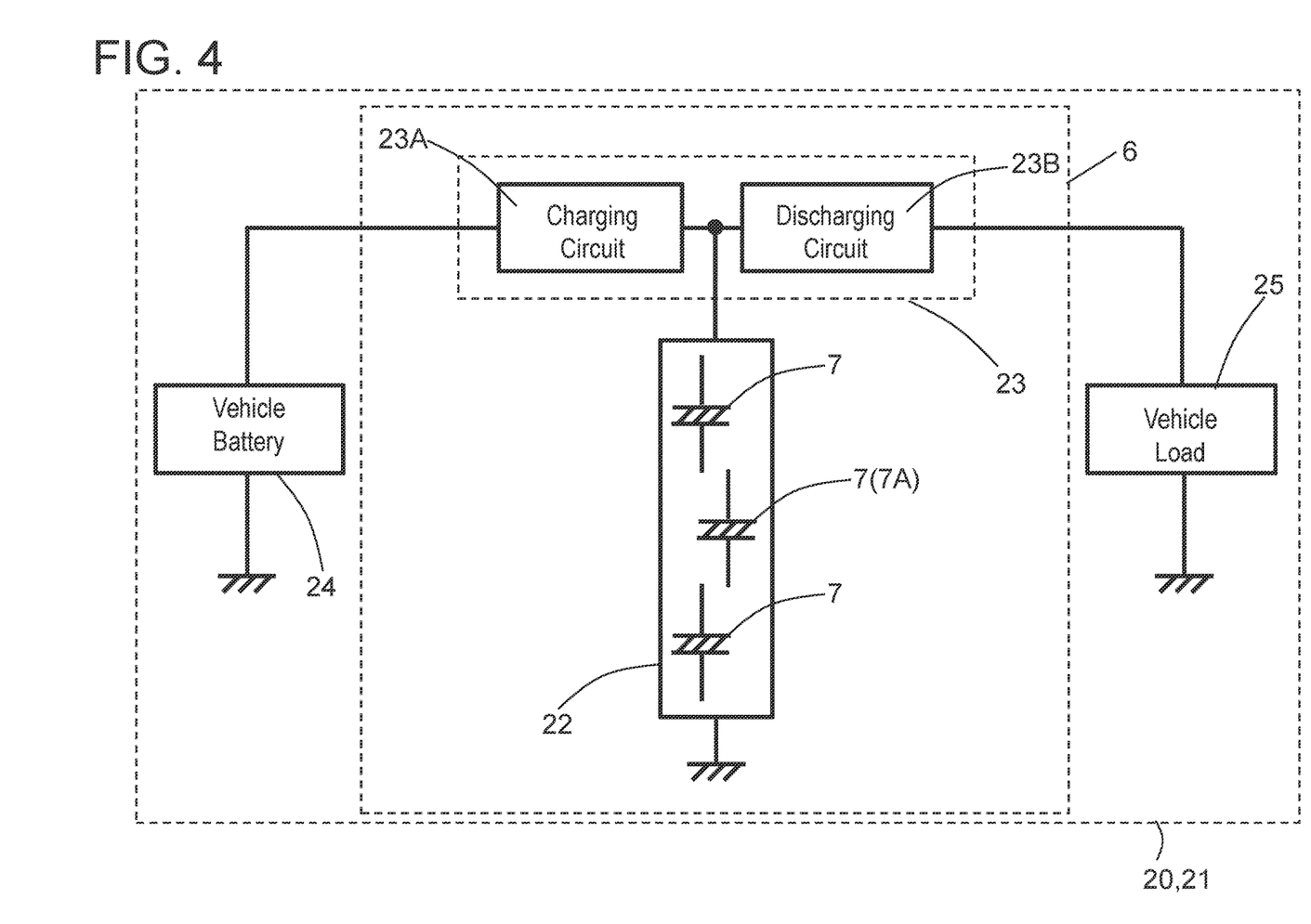
FIG. 4 is a circuit block diagram of the onboard power supply device in accordance with the embodiment.

Onboard power supply device 6 will be detailed below. FIG. 4 is a circuit block diagram of onboard power supply device 6. Onboard power supply device 6 includes power storage circuit 22 and charge-and-discharge circuit 23. Charge-and-discharge circuit 23 includes charging circuit 23A and discharging circuit 23B. Onboard power supply device 6 is mounted on body 21 of vehicle 20. The capacitors 7 are connected in series or in parallel to each other to constitute power storage circuit 22. Charging circuit 23A of charge-and-discharge circuit 23 charges power storage circuit 22, and discharging circuit 23B discharges power storage circuit 22. The entirety of charge-and-discharge circuit 23 may constitute heat-generating component 10, or charging circuit 23A or discharging circuit 23B may constitute heat-generating component 10 individually. Further, a semiconductor switching element, a transformer, and a choke coil which are included in charging circuit 23A or discharging circuit 23B may constitute heat-generating component 10.

Onboard power supply device 6 supplies electric power to vehicle load 25 mainly as an auxiliary role of vehicle battery 24. In order to supply high current for a short period of time, power storage circuit 22 is constituted by the capacitors 7 having shapes and characteristics substantially identical to one another. In order to supply large current for a short period of time, each capacitor 7 preferably has a low internal resistance, and is preferably an electric double layer capacitor.

Since the capacitors 7 have substantially the same characteristics, the characteristics degrade in substantially the same manner due to the heat received from the outside of capacitors 7. For instance, in the case that heat is propagated concentratively to capacitor 7A among the capacitors 7, capacitor 7A may degrade extremely 7A more than the other capacitors. When capacitor 7A degrade extremely, the characteristics of onboard power supply device 6 degrades quickly. Holder 8 has not only a function holding the capacitors 7 but also a function preventing the concentrative heat propagation to specific capacitor 7A among the capacitors 7. Therefore, holder 8 allows the capacitors 7 to degrade uniformly while suppressing in the degradation of the capacitors 7.

As mentioned above, each capacitor 7 includes lead terminal 11 and capacitor body 12. Holder 8 includes base part 13, holding parts 14, holding parts 15, and fixing part 16. The holding parts 14 correspond to the capacitors 7 on one-by-one basis. The holding parts 15 correspond to the capacitors 7 on one-by-one basis. Fixing part 16 extends from an outer edge of base part 13 toward mounting board 9 and is fixed to mounting board 9.

Base part 13, the holding parts 14, the holding parts 15, and fixing part 16 are provided basically as a single structure made of a single resin. Alternatively, at least base part 13, the holding parts 14, and the holding parts 15 may be are provided as a single structure made of a single resin. This configuration allows heat generated in any one of base part 13, the holding parts 14, the holding parts 15, and fixing part 16, or the heat propagated to any one of base part 13, the holding parts 14, the holding parts 15, and fixing part 16 to be easily diffused into the entirety of holder 8 constituted by base part 13, the holding parts 14, the holding parts 15, and fixing part 16. Therefore, holder 8 allows the capacitors 7 to degrade substantially uniformly while suppressing the degradation of the capacitors 7. Further, each holding part 14 is connected to a corresponding one of holding part 15 via connecting part 26. Connecting part 26, holding part 14, and holding part 15 are provided as a single structure made of a single resin. The heat capacity of holder 8 may be larger than a total of heat capacities of the capacitors 7. Thus, the heat propagated to holder 8 is hardly propagated to capacitor body 12 of each capacitor 7.

The holding parts 14 are bundled by base part 13. Capacitor body 12 of each capacitor 7 is held by a corresponding holding part 14. The holding parts 14 are connected to one another. The capacitors 7 are bundled by base part 13. At this time, capacitors 7C located on an inner side of the capacitors 7 are surrounded by capacitors 7P located on an outer peripheral side of the capacitors 7, as shown in FIG. 1. Thus, twelve capacitors 7P located in the outer peripheral side among sixteen capacitors 7 shown in FIG. 1 are held by the corresponding holding parts 14 directly connected to base part 13, and four capacitors 7C located on the inner side among sixteen capacitors 7 shown in FIG. 1 are held by the corresponding holding parts 14 connected to each other.

Projection parts 14A and 14B are provided from each holding part 14. Projection part 14A projects from holding part 14 in an upward direction of the figure, and contacts capacitor body 12 of capacitor 7. Projection part 14B projects from holding part 14 in a downward direction of the figured, and contacts capacitor body 12 of capacitor 7. In other words, projection part 14A projects from a portion of holding part 14 opposite to mounting board 9 in a direction opposite to a direction toward mounting board 9, and contacts capacitor body 12 of capacitor 7. Projection part 14B projects from a portion of holding part 14 facing mounting board 9 toward mounting board 9, and contacts capacitor body 12 of capacitor 7.

Projection part 14A and projection part 14B hold capacitor body 12 individually like each holding part 14 to hold capacitor 7. Projection part 14A and projection part 14B hold not the entire circumference of capacitor body 12 of capacitor 7. In other words, capacitor body 12 of each capacitor 7 is held at separated plural points by projection parts 14A and projection parts 14B. This configuration enlarges a surface of capacitor body 12 of capacitor 7 exposed from holder 8. The projection parts 14A and the projection parts 14B thus hold capacitor body 12 of capacitor 7 well-balanced together with holding part 14.

Capacitor body 12 of capacitor 7 has the enlarged exposed surface. Even if temperature of capacitor body 12 of capacitor 7 rises, the exposed surface emits heat to atmosphere, accordingly preventing excessive temperature rise of capacitor 7.

Capacitor body 12 of capacitor 7 may be held at separated plural points by plural projection parts 14A and plural projection parts 14B. This configuration allows axis directions D12 of capacitor bodies 12 of all the capacitors 7 to be easily aligned. As this result, even if axis direction D12 of capacitor body 12 of each capacitor 7 is inclined, a stress will be avoided from concentrating at capacitor body 12 of specific capacitor 7A or lead terminal 11 of specific capacitor 7A, thus increasing reliability of onboard power supply device 6.

Projection part 14A and projection part 14B arranged in the following positional relationship hold capacitor body 12 of each capacitor 7 with sufficient balance. Projection part 14A projects from holding part 14 in a direction opposite to mounting board 9. Projection part 14B projects from holding part 14 toward mounting board 9. Opening area 14C having no projection part 14A therein is provided opposite to of mounting board 9 with respect to holding part 14. Projection part 14B is provided opposite to opening area 14C with respect to holding part 14 in a direction toward mounting board 9. In other words, projection part 14A does not overlap projection part 14B when viewed in axial direction D12 of capacitor body 12. This configuration allows projection part 14A and projection part 14B to hold capacitor body 12 of capacitor 7 with sufficient balance while enlarging the area of the exposed surface of capacitor body 12 exposed from holder 8.

In accordance with the embodiment, holder 8 includes projection parts 14A and projection parts 14B. Each holding part 14 may include projection parts 14A with no projection part 14B. Alternatively, each holding part 14 may include projection parts 14B with no projection part 14A.

Each holding part 14 may include none of projection parts 14A and 14B.

At least base part 13, the holding parts 14, and the holding parts 15 are provided as a single structure as mentioned above, consequently being coupled thermally to one another securely. Accordingly, even if a heat source exists close to specific capacitor 7A among the capacitors 7, heat is diffused into the entirety of holder 8 immediately because the heat source is also located close to each holding part 14 that holds capacitor body 12 of specific capacitor 7A.

Each holding part 15 is connected to a corresponding holding part 14. Each holding part 15 holds lead terminal 11 of capacitor 7. In this configuration, heat is propagated to lead terminal 11 from heat-generating component 10 via mounting board 9 and joint part 18. After that, most of the heat is propagated from each holding part 15 to corresponding holding part 14, and further is propagated to base part 13. This configuration prevents heat propagation to capacitor body 12 of each capacitor 7.

In order to ensure a thermal connection between each holding part 15 and mounting board 9, through-hole 17 formed in mounting board 9 is provided coaxially with holding through-hole 19 formed in each holding part 15. In other words, through-hole 17 and holding through-hole 19 extend along through-axis 17L, a straight line passing through through-hole 17 and holding through-hole 19 (see FIG. 3). Each capacitor 7 includes two lead terminals 11. Therefore, two holding through-holes 19 are formed in one holding part 15 holding one capacitor 7. Each lead terminal 11 passes through through-hole 17 and holding through-hole 19. Each lead terminal 11 is joined to through-hole 17 with joint part 18. Further, a wiring pattern is formed not only on surface 9B of mounting board 9 but also on an inner wall of through-hole 17. This configuration enhancing a thermal connection between mounting board 9 and each lead terminal 11 via joint part 18. Each lead terminal 11 contacts the inner wall of holding through-hole 19 provided in holding part 15, and passes through holding through-hole 19 and through-hole 17.

Holding through-hole 19 may not necessary have a diameter equal to or smaller than an outer diameter of lead terminal 11. In other words, as long as the inner wall of holding through-hole 19 partially contacts a part of an outer circumference of lead terminal 11, the entire surface of the inner wall of holding through-hole 19 may not necessarily contact lead terminal 11. The he inner wall of holding through-hole 19 partially contacting a part of an outer surface of lead terminal 11 reduces heat propagated to capacitor body 12 from mounting board 9 via joint part 18 and lead terminal 11 since part of the heat is divided and flows into each holding part 15.

In the above-mentioned configuration, heat-generating component 10 may be disposed close to the capacitors 7, accordingly reducing the size of onboard power supply device 6.

Holding part 15 may contact mounting surface 9A of mounting board 9, or face mounting surface 9A of mounting board 9 across spaces 15S without contacting mounting surface 9A. In the case that holding part 15 contacts mounting board 9, the heat generated in mounting board 9 is propagated to holder 8 efficiently. On the other hand, in the case that holding part 15 faces mounting board 9 across space 15S without contacting mounting board 9, heat required for welding joint part 18 does not flow to holder 8 especially when lead terminal 11 is mounted on mounting board 9, thereby forming joint part 18 stably.

In accordance with the embodiment, capacitor body 12 has a circular column shape. Holding part 14 for holding capacitor body 12 has a cylindrical shape or an annular shape having hollow part 14S. Capacitor body 12 is inserted into hollow part 14S of holding part 14 in axis direction D12. Holding through-hole 19 into which lead terminal 11 is to be inserted is formed coaxially with through-hole 17. Thus, the position of capacitor 7 is inevitably restricted in a rotational direction about an insertion axis extending in a direction in which capacitor 7 is inserted into holding part. Therefore, capacitor body 12 may not necessary have a shape for restricting its direction, but may have a circular column shape.

During traveling of vehicle 20, onboard power supply device 6 receives mechanical stress, such as vibration, from body 21. Holder 8 weakens the stress applied to each capacitor 7, especially lead terminal 11, from body 21, so that connection reliability of lead terminal 11 or joint part 18 is improved. Particularly in the case that capacitor body 12 has a circular column shape and holding part 14 holding capacitor body 12 has a cylindrical shape or an annular shape, holding part 14 fixes capacitor body 12 in a flexible mutual positional relationship, which provides a space between holding part 14 and capacitor body 12, without fixing it completely. Accordingly, the stress applied to lead terminal 11 in a twisting direction is weakened.

In the above description, holder 8 is used to obtain the size reduction effect, from a viewpoint of characteristics at the time when onboard power supply device 6 is operated. In the following description, holder 8 effectively functioning at the time when each capacitor 7 is mounted on mounting board 9, in other words, even when onboard power supply device 6 is manufactured will be described.

When capacitor body 12 is inserted into holding part 14 of holder 8, lead terminal 11 is simultaneously inserted into holding through-hole 19 of holding part 15, and then, inserted into through-hole 17. Since holding through-hole 19 is coaxially with through-hole 17, lead terminal 11 is smoothly inserted at once into holding through-hole 19 and through-hole 17 which are located in different planes.

Taper guide 15A which is tapered from holding through-hole 19 of each holding part 15 toward capacitor body 12 is further provided. Thus, lead terminal 11 is easily inserted into holding through-hole 19 before lead terminal 11 is inserted into through-hole 17. As the result, lead terminal 11 is easily inserted into both holding through-hole 19 and through-hole 17.

When lead terminal 11 is mounted to mounting board 9 by soldering or the like, heat is propagated to the lead terminal 11 and divided into holding part 15 and capacitor body 12 of capacitor 7 since holding through-hole 19 contacts lead terminal 11. This configuration suppresses heat applied to capacitor body 12 of each capacitor 7, and accordingly suppresses characteristic degradation of capacitor 7 which is caused by the heat.

Holding part 15 and mounting board 9 are located via space 15S in between in a non-contact manner. In this configuration, it is easily visually confirmed, in a direction from capacitor 7, whether or not joint part 18 forms a fillet on mounting board 9 shown in FIG. 3. As mentioned above, a conductive wiring pattern is provided on the inner wall of through-hole 17. Thus, when lead terminal 11 is mounted to mounting board 9, if the mounting is performed appropriately, joint part 18 forms a fillet on mounting surface 9A and surface 9B of mounting board 9 along lead terminal 11. Therefore, holding part 15 and mounting board 9 via space 15S in between in a non-contact manner, mounting conditions can be checked.

As described above, onboard power supply device 6 includes capacitors 7, holder 8 holding the capacitors 7, mounting board 9 on which the capacitors 7 are mounted and to which holder 8 is fixed, and heat-generating component 10 mounted on mounting board 9. Each of the capacitors 7 includes capacitor body 12 and lead terminal 11 extending from capacitor body 12. Holder 8 includes base part 13, holding parts 14 bundled by base part 13, holding parts 15 each connected to a corresponding one of the holding parts 14, and fixing part 16 extending from an outer edge of base part 13 toward mounting board 9 and fixed to mounting board 9. The holding parts 14 hold capacitors 7. Capacitor body 12 of each of the capacitors 7 is held by a corresponding one of the holding parts 14. Lead terminal 11 of each of the plurality of capacitors 7 is held by a corresponding one of the holding parts 15. Mounting board 9 has through-holes 17 therein. The lead terminal 11 of the each of the capacitors passes through a corresponding one of the though-holes 17. Through-hole 17 is connected to lead terminal 11. Holding parts 15 have holding through-holes 19 therein. Holding through-hole 19 extends along through-axis 17L coinciding with through-hole 17. An inner wall of holding through-hole 19 contacts lead terminal 11.

Mounting board 9 has mounting surface 9A facing each capacitor 7. The holding parts 15 face mounting surface 9A of mounting board 9 across space 15S.

Capacitor body 12 may have a circular column shape. Each of the holding parts 14 may have an annular shape, and holds capacitor body 12.

Holder 8 may further includes projection parts 14A each projecting from a corresponding one of the holding parts 14 in a direction opposite to mounting board 9. Capacitor body 12 of each of the capacitors 7 may contact a corresponding one of the projection parts 14A.

Holder 8 may further include projection parts 14B each projecting from a corresponding one of the holding parts 14 toward mounting board 9. Capacitor body 12 of each of the capacitors 7 may contact a corresponding one of the projection parts 14B.

Each projection part 14A may not overlap corresponding each projection part 14B when viewed in axial direction D12 of capacitor body 12.

REFERENCE MARKS IN THE DRAWINGS 6 onboard power supply device
7 capacitor
8 holder
9 mounting board
10 heat-generating component
11 lead terminal
12 capacitor body
13 base part
14 holding part (first holding part)
14A projection part (first projection part)
14B projection part (second projection part)
14C opening area
15 holding part (second holding part)
15A taper guide
16 fixing part
17 through-hole
18 joint part
19 holding through-hole
20 vehicle
21 body
22 power storage circuit
23 charge-and-discharge circuit
23A charging circuit
23B discharging circuit
24 vehicle battery
25 vehicle load
26 joint part

The invention claimed is:

1. An onboard power supply device comprising:
a plurality of capacitors;
a holder holding the plurality of capacitors;
a mounting board having the plurality of capacitors mounted thereto and having the holder fixed thereto; and
a heat-generating component mounted on the mounting board, wherein
each of the plurality of capacitors includes a capacitor body and a lead terminal extending from the capacitor body,
the holder includes:
a base part;
a plurality of first holding parts bundled by the base part, the plurality of first holding parts holding the plurality of capacitors;
a plurality of second holding parts each connected to a corresponding one of the plurality of first holding parts; and
a fixing part extending from an outer edge of the base part toward the mounting board and being fixed to the mounting board,
the capacitor body of the each of the plurality of capacitors is held by a corresponding one of the plurality of first holding parts,
the lead terminal of the each of the plurality of capacitors is held by a corresponding one of the plurality of second holding parts, the mounting board has through-holes provided therein, the lead terminal passing through a corresponding one of the through-holes, the corresponding one of through-holes being connected to the lead terminal of the each of the plurality of capacitors, the corresponding one of the plurality of second holding parts has a holding through-hole therein extending along a through-axis coinciding with the through-hole, and an inner wall of the holding through-hole contacts the lead terminal of the each of the plurality of capacitors.

2. The onboard power supply device according to claim 1, wherein the mounting board has a mounting surface facing the plurality of capacitors, and the plurality of second holding parts face the mounting surface of the mounting board across a space.

3. The onboard power supply device according to claim 1, wherein the capacitor body has a circular column shape, and the corresponding one of the plurality of first holding parts has an annular shape and holds the capacitor body of the each of the plurality of capacitors.

4. The onboard power supply device according to claim 1, wherein the holder further includes a plurality of first projection parts each projecting from a corresponding one of the plurality of first holding parts in a direction opposite to the mounting board, and the capacitor body of the each of the plurality of capacitors contacts a corresponding one of the plurality of first projection parts.

5. The onboard power supply device according to claim 4, wherein the holder further includes a plurality of second projection parts each projecting from a corresponding one of the plurality of first holding parts toward the mounting board, and the capacitor body of the each of the plurality of capacitors contacts a corresponding one of the plurality of second projection parts.

6. The onboard power supply device according to claim 5, wherein the corresponding one of the plurality of first projection parts does not overlap the corresponding one of the plurality of second projection parts when viewed in an axial direction of the capacitor body of the each of the plurality of capacitors.

7. The onboard power supply device according to claim 1, wherein the holder further includes a plurality of projection parts each projecting from the corresponding one of the plurality of first holding parts toward the mounting board, and the capacitor body of the each of the plurality of capacitors contacts a corresponding one of the plurality of projection parts.

\* \* \* \* \*